US005730620A

United States Patent [19]

Chan et al.

[11] Patent Number: 5,730,620

[45] Date of Patent: Mar. 24, 1998

[54] METHOD AND APPARATUS FOR LOCATING ELECTRICAL CIRCUIT MEMBERS

[75] Inventors: Benson Chan, Vestal; Fletcher L. Chapin, Maine; Theodore W. Blizinski, Waterford, all of N.Y.

[73] Assignee: International Business Machines Corporation, Armonk, N.Y.

[21] Appl. No.: 525,861

[22] Filed: Sep. 8, 1995

[51] Int. Cl.⁶ .................................................. H05K 1/00
[52] U.S. Cl. ...................................... 439/526; 439/71
[58] Field of Search ................ 439/526, 70, 71, 439/73, 66

[56] References Cited

U.S. PATENT DOCUMENTS

| | | | |
|---|---|---|---|
| 5,142,449 | 8/1992 | Littlebury et al. | 361/400 |
| 5,175,491 | 12/1992 | Ewers | 324/158 F |
| 5,205,742 | 4/1993 | Goff et al. | 439/73 |
| 5,248,262 | 9/1993 | Busacco et al. | 439/66 |
| 5,290,193 | 3/1994 | Goff et al. | 439/331 |
| 5,315,481 | 5/1994 | Smolley | 439/66 |
| 5,419,710 | 5/1995 | Pfaff | 439/71 |
| 5,536,181 | 7/1996 | Karnavas | 439/70 |

FOREIGN PATENT DOCUMENTS 1-308095 A  12/1989  Japan.
4-10635 A  1/1992  Japan.

OTHER PUBLICATIONS

Technical Disclosure Bulletin: vol. 36 No. 10 Oct. 1993 "Flip Chip Burn–in Socket".

Technical Disclosure Bulletin: vol. 33 No. 5 Oct. 1990. "Compressible–Contact Interconnection Scheme".

IBM Microelectronics: CBeam™ Assembly Instructions.

*Primary Examiner*—Gary F. Paumen
*Attorney, Agent, or Firm*—Calfee, Halter & Griswold

[57] ABSTRACT

Electrical components such as IC modules and printed circuit boards, at least one of which has an array of solder balls or other protruding conductors, are connected quickly, precisely and economically with a component locator having openings adapted to capture the protruding conductors. The locator is aligned with one of the components, and the other component is pressed against the locator. The protruding conductors enter the capture openings and complete electrical circuits with contacts on the other conductor.

17 Claims, 6 Drawing Sheets

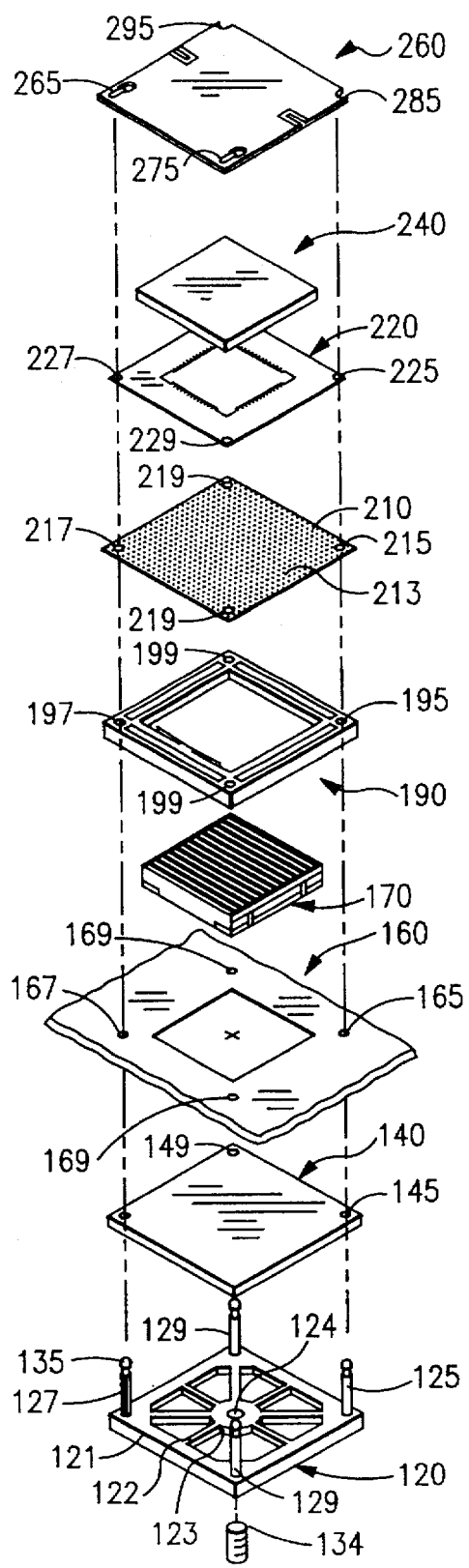
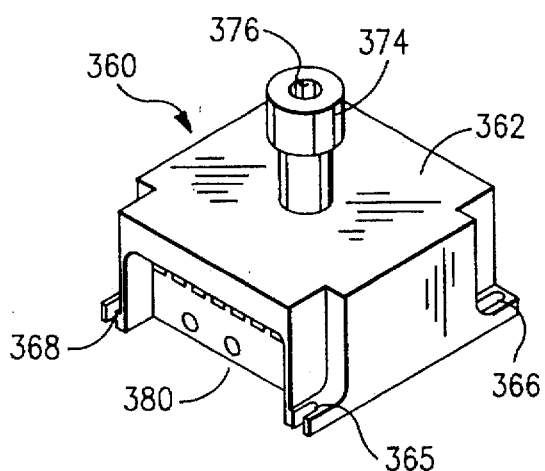
FIG.13
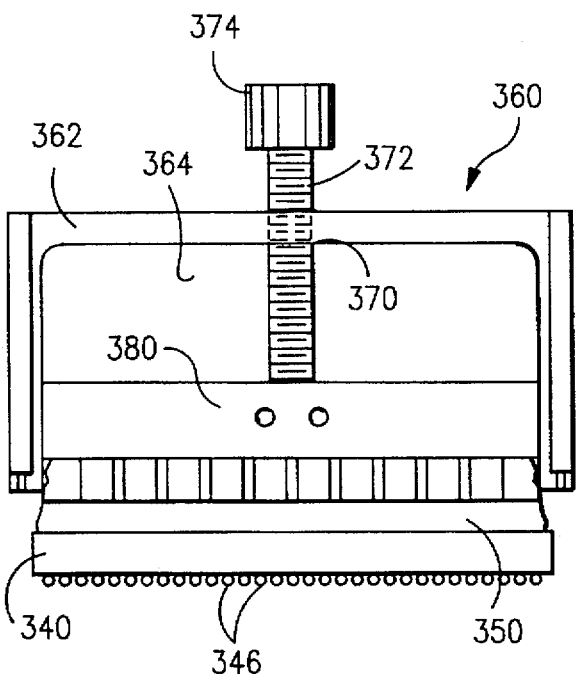
FIG.14
FIG.1

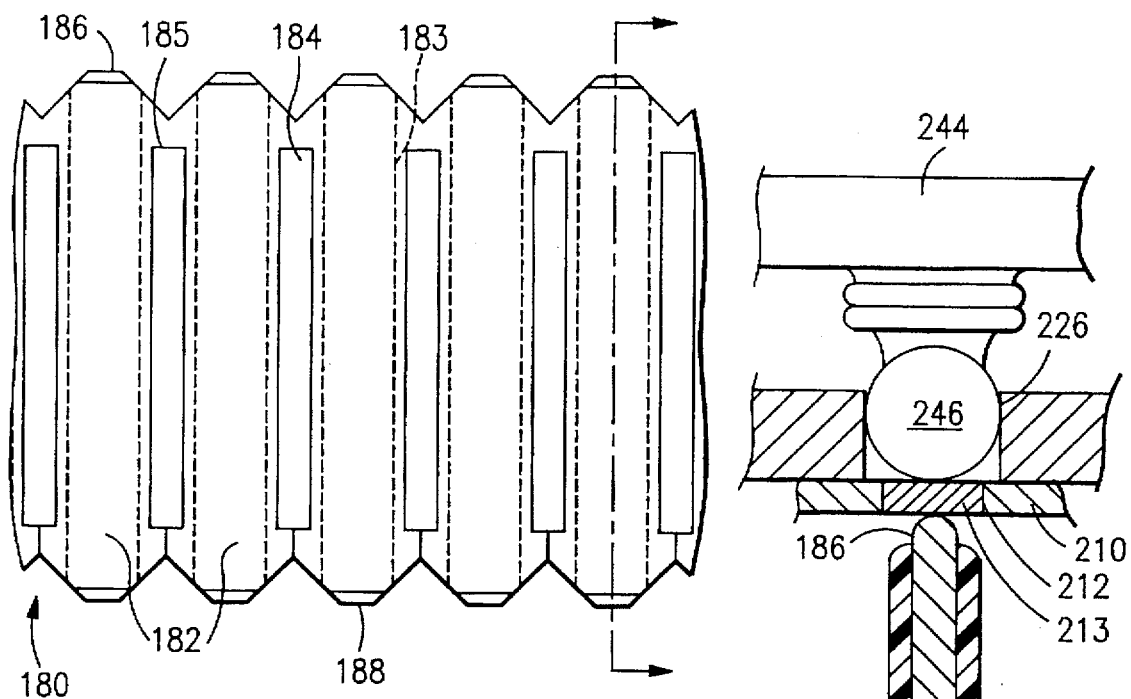
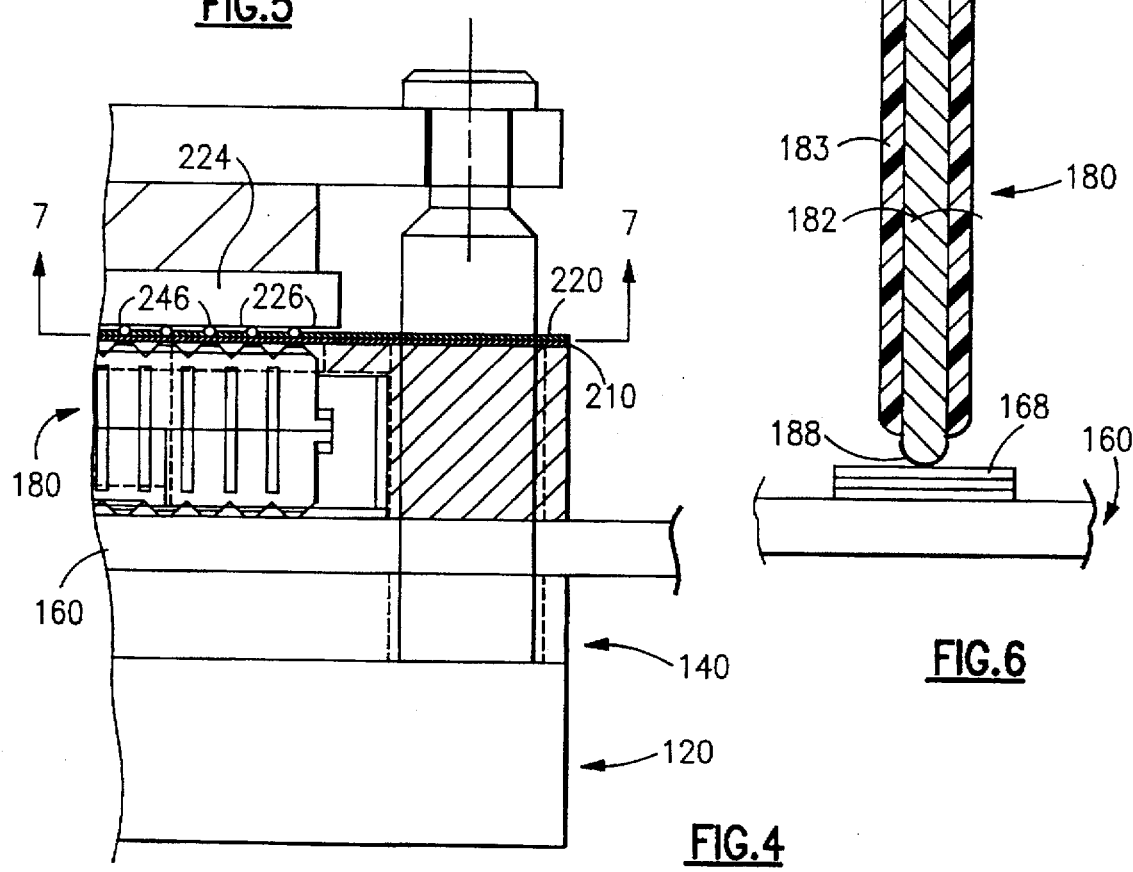

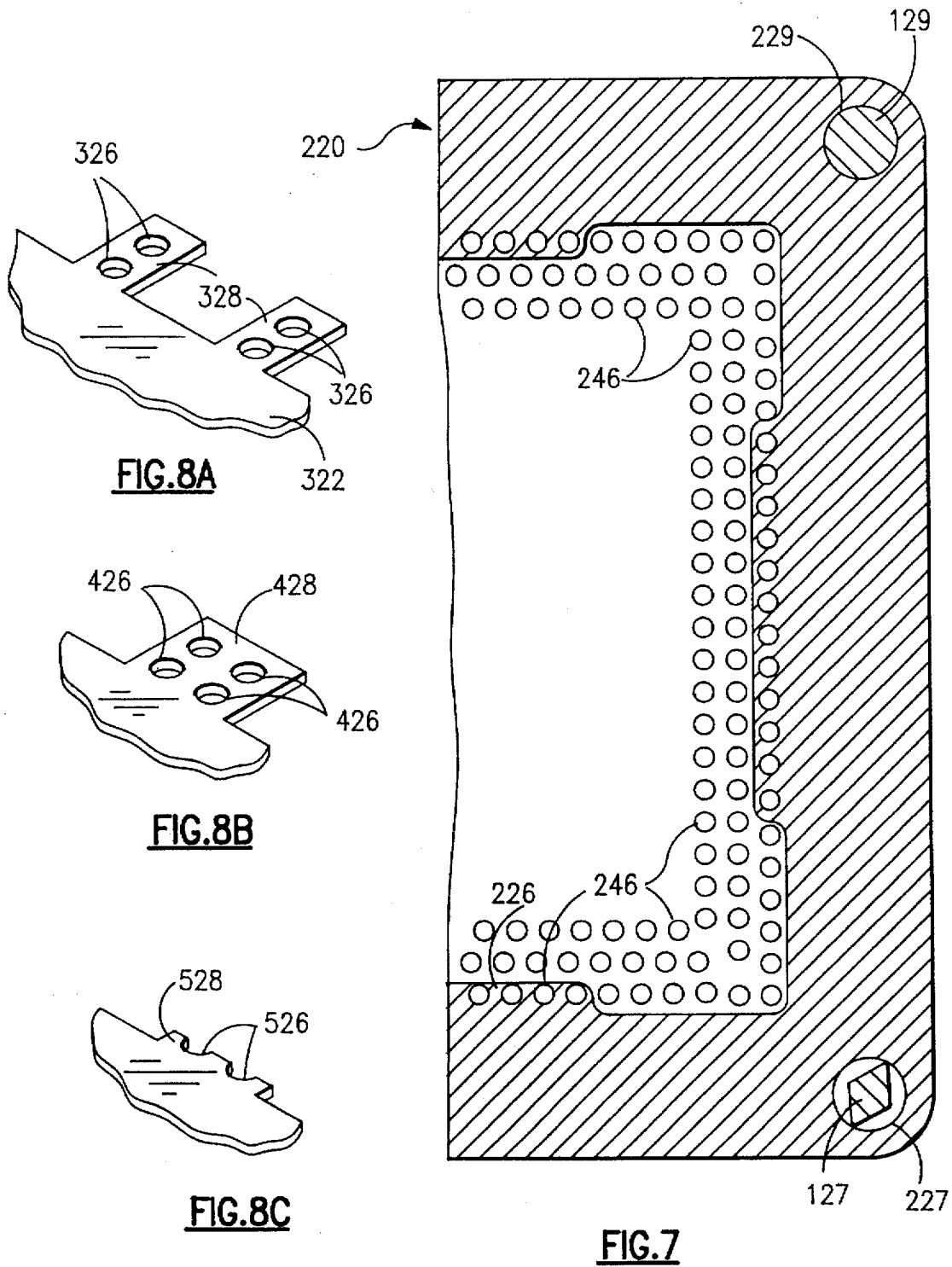

METHOD AND APPARATUS FOR LOCATING ELECTRICAL CIRCUIT MEMBERS

FIELD OF THE INVENTION

This invention relates to the field of electrical connectors. More particularly, it relates to a method and apparatus for locating and aligning electrical circuit members such as integrated circuit or chip modules; printed circuit boards, and electrical connectors for these components so that they can be connected precisely and economically.

BACKGROUND OF THE INVENTION

With the continuing trend towards miniaturization of electrical systems such as information handling systems (computers), set top boxes, automotive computers and the like, the margin of error for connecting components in these systems continues to decrease. As the pitch of the array tightens, i.e. as the distances between balls decreases, the tolerances for misalignment get smaller and the risk of connections to incorrect pads gets bigger.

One type of system for connecting electrical components or modules, commonly referred to as a ball grid array or BGA, uses an array of small solder balls, typically of 90/10 solder, i.e. solder that is 90% tin and 10% lead. These balls are connected to contact pads on the module with lower melting temperature solder, typically 63/37 solder (63% tin and 37% lead). The module, with balls attached, is positioned so that the balls contact pads or other conductors on the surface of another electrical component, such as a printed circuit board, a connector for a printed circuit board, or another module. The pads on the other conductor will also have solder paste, usually 63/37 solder, screened on to accept the module. Typically, the assembly is then heated to melt the solder paste and bond the two components together. With this type of attachment, the module is located and held by the reflowed 63/37 solder. The balls and contact pads must be aligned precisely to avoid improper connections.

The solder process actually self centers the module on the contact pads. However, in some instances, such as when the components are being temporarily assembled for testing, permanent attachment is not desirable. In these situations, another mechanism is needed to perform the same function at a minimal cost with the same degree of accuracy.

SUMMARY OF THE INVENTION

It is an object of this invention to provide an improved method and apparatus for locating and connecting electrical circuit members. A further objective is to provide an economical mechanism for locating ball grid arrays, including TBGA or taped ball grid arrays that use a tape (typically a polyimid) carrier for wiring and mounting the balls, CBGA or ceramic ball grid arrays wherein the balls are applied to pads or contacts on a circuitized ceramic carrier, and PBGA or plastic ball grid arrays, which use a plastic or organic carrier, with reference to other circuit components with location tolerances within ±0.003 inches of the ball center.

These objectives are accomplished with a connector system employing an electrically insulating component locator positioned between two electrical components to be connected. One of the components has a plurality of conductive contacts on at least one surface. The other component has a plurality of solder balls, solder columns or other conductive members protruding from at least one surface. Each of the protruding conductive members is spaced to contact at least one of the contacts on the first component. The component locator has a plurality of ball capture openings that are sized and spaced so that at least some of the protruding conductive members extend into the openings and make connections with pre-selected contacts on the first component. The component locator aligns the second component properly, and maintains it in the desired position.

Another objective of the invention is to provide an improved method for positioning an electrical component, having conductors protruding from at least one surface, with respect to a second electrical component. A component locator, having openings adapted to receive said protruding conductors, is aligned with the second electrical component. The first electrical component is placed against the component locator so that the protruding conductors extend into the openings in the component locator and contact predetermined contacts on the second component. The first component is pressed against the locator to hold it in position and ensure electrical contact.

Yet another object of this invention is to provide a method of temporarily connecting a plurality of electrical components so that at least one can be tested. A component locator is aligned with one of the components, which has contacts on at least one surface. The component locator has openings spaced to correspond to at least some of the contacts. A second component, with protruding conductors spaced and adapted to complete electrical circuits with preselected contacts, is aligned with the component locator. The second component is placed against the locator frame so that at least some of said protruding conductors extend into some of said openings and make contact with some of said contacts. The second component is then pressed against the components locator to ensure good electrical contact for testing.

If desired, the second component and the locator frame can be removed after the test so that the frame can be used for other tests with other components. Alternatively, the locator frame can be left in place while the two components are soldered together, which helps to ensure good connections and minimizes the risks of short circuits.

Other objects and advantages of this invention will be apparent from the following detailed description.

DRAWINGS

FIG. 1 is an exploded perspective view of one embodiment of this invention.

FIG. 4 is an enlarged, partial cross-sectional view showing the positions of the components in FIG. 1, as assembled.

FIG. 5 is a further enlarged detail view of a buckling beam connector used in the compressible connector assembly of the illustrated system.

FIG. 6 is a still further enlarged detail view of the buckling beam connector, taken along lines 6—6 of FIG. 5. This Figure shows the relationship of the buckling beam connector to solder balls on a IC circuit module, to vias in a redistribution film, to the component locator used in this system, and to contacts on a printed circuit board.

FIG. 7 is a partial cross-sectional plan view along lines 7—7 of FIG. 4.

FIGS. 8A, 8B, and 8C are perspective, fragmentary detail views of alternative component locators.

Figure 9:
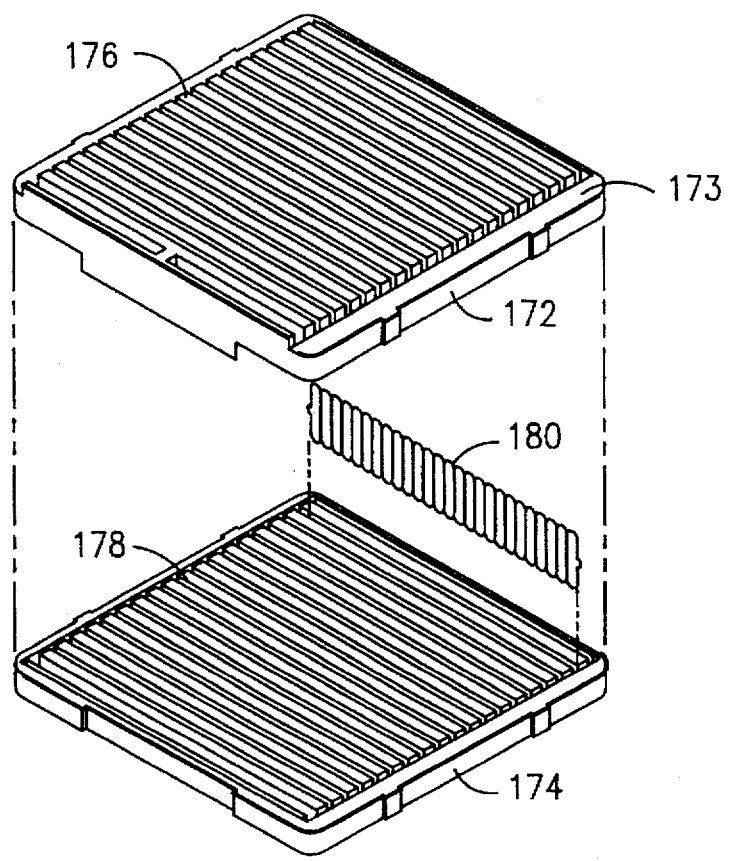

FIG. 9 is an exploded perspective view of a compressible connector assembly used in the system of FIG. 1.

Figure 10:
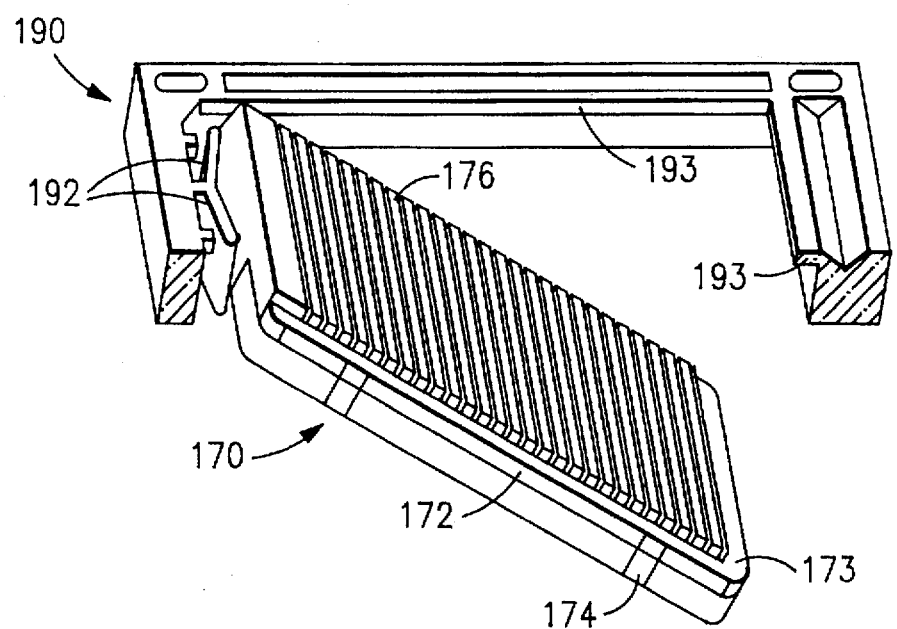

FIG. 10 is a partially sectioned perspective view of a housing frame for the compressible connector assembly, and the connector assembly, illustrating the assembly of these components.

Figure 11:
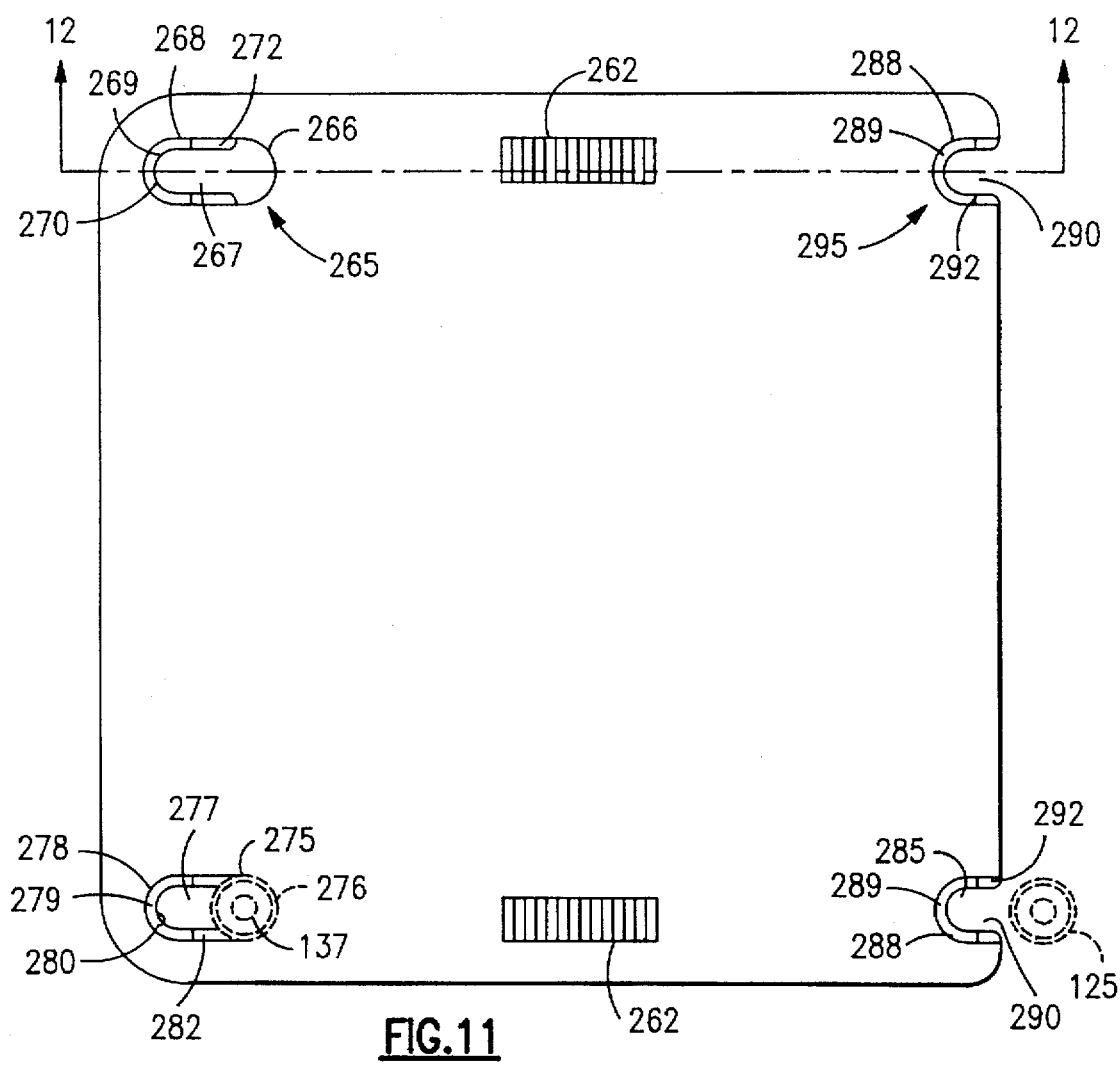

FIG. 11 is a plan view of the latch shown in FIG. 1. The heads of two of the four pins that locate the components and, in cooperation with the latch, hold the system together, are shown in phantom in their position at the beginning of the latching process.

Figure 12A:
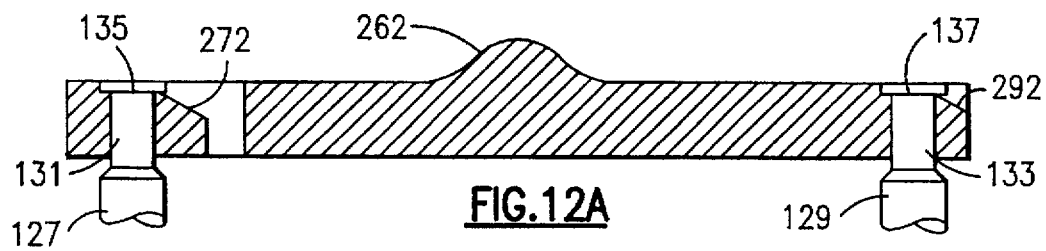
Figure 12B:
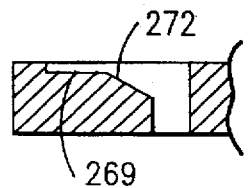
Figure 12C:
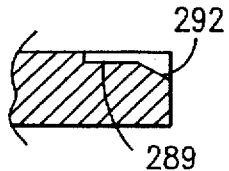

FIG. 12A is a cross-sectional elevation view along lines 12—12 in FIG. 11, when the latching process is complete. FIGS. 12B and 12C are cross-sectional detail views of slots in the latch in which the pins are secured.

FIG. 13 is a perspective view of an actuator that may be used in place of the latch illustrated in FIGS. 1, 11 and 12.

FIG. 14 is an elevation view of the actuator shown in FIG. 13.

DETAILED DESCRIPTION

The embodiment of this invention illustrated in FIG. 1 includes, from bottom to top, a locator/stiffener 120, a spacer 140, a printed circuit board assembly 160, a compressible connector assembly 170 with an outer housing 190, a redistribution film 210 with vias 213, a component locator 220, an integrated circuit or IC module 240, and a latch or actuator 260. The locator/stiffener, spacer, compressible connector assembly, outer housing, redistribution film, component locator and latch are sometimes referred to as a socket, which connects IC module 240 to PC board 160.

Figure 2:
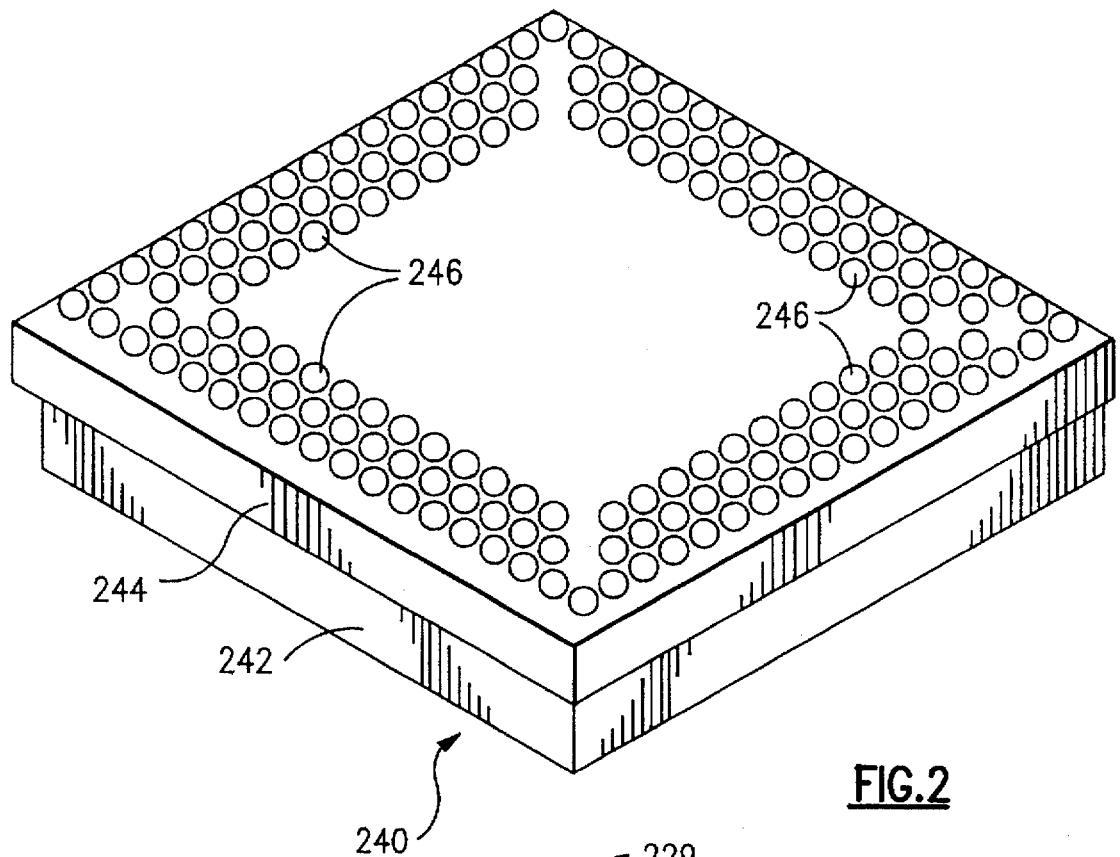
FIG. 2 is a perspective view of an integrated chip module suitable for use in the system shown in FIG. 1, turned over to illustrate the protruding electrical connectors on one side of the module.

As may be seen in FIG. 2, wherein the IC module 240 is inverted to better illustrate connecting members thereon, module 240 includes a housing cap 242 for a chip (not shown), and a circuitized carrier 244 with several rows of solder balls 246 on its surface. The circuitized carrier 244 may be of ceramic, of an organic such as KAPTON™, a polyimid made by Dupont which is frequently used in TBGA carriers, or of epoxy glass laminates, which are frequently used in PBGA carriers. Balls 246 are electrically connected to the chip in housing 242 by circuits in the circuitized carrier 244.

For ease of illustration, IC module 240 is shown with 3 rows of balls 246 (per side), with 19 balls in the outer row on each side. In most installation, balls will be uniformly spaced over the surface of the carrier 244, and the number of balls will be matched with the number of contacts on compressible connector assembly 170. The compressible connector assembly shown herein has 25×25 or 625 contacts. This invention can be used for a wide variety of connector assemblies and modules, however, including modules with a 12×17 solder ball grid up to the largest grids normally available at the present—a 50 mm square module with a 39×39 ball grid.

Figure 3:
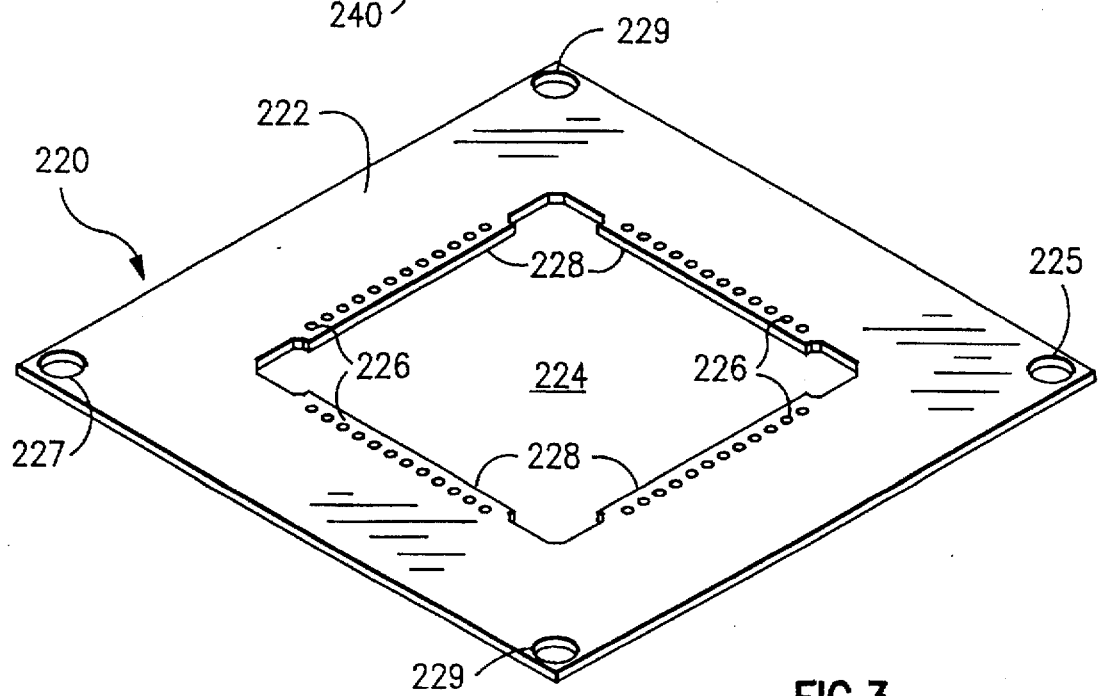
FIG. 3 is a perspective view of a component locator.

FIG. 3 illustrates the component locator 220 used to align the IC module 240 (as seen in FIGS. 1 and 4) with the redistribution film 210, with the compressible connector assembly 170, and with the PC board 160. Component locator 220 has a frame 222 with a central opening 224. Ball capture openings 226 are placed in locator frame 222 only where required to provide alignment. This is usually no more than ½ the amount of solder balls along the length of the module. For example, for an array of 25×25 balls, 12 ball capture openings along each side of the locator frame should suffice. This reduces the processing time for producing these frames, thus reducing the costs. The frames can be made using standard numerically controlled machining methods or by the use of laser machining. Custom punch/dies may be used for large volumes.

The component locator 220 should be of a material that is electrically insulating and that has thermal expansion characteristics that are reasonably matched, preferably within about 15 to 20 percent, to the expansion characteristics of the printed circuit board 160. The material also needs to be capable of withstanding heat generated or experienced by the components in service. For example, where the frame is used to make temporary connections for module burn-in, the frame must be capable of withstanding temperatures of 150° C. for periods up to 48 hours.

A preferred material for the component locator is VALOX® film for electrical insulation, a thermoplastic polyester material which is readily available in sheets of different thicknesses from General Electric Plastics. To reduce shrinkage in operation this material is pre-stressed or heated at 160° C. for 30 minutes to pre-shrink the material before the frames are manufactured either by NC machining or laser machining.

Tabs 228 extend into the central opening 224 in the component locator 220 from each of the four sides of frame 222. Each of the tabs 228 has a row of ball capture openings 226 which are sized and spaced to correspond to solder balls 246 in the outer rows of the ball grid array on the circuitized ceramic member 244. In a typical installation, with solder balls about 0.035" in diameter, the capture openings 226 are preferably about 0.040" in diameter.

As may be seen in FIGS. 6, when the components are assembled the solder balls 246 extend into the openings 226 and contact vias 213 in a redistribution film 210, which helps to prevent damage to the solder balls. Film 210 is preferably of a polyimide such as KAPTON™ or another suitable dielectric such as an epoxy resin glass system. Passageways 212 are formed in the film and filled, using conventional technology, with copper or other suitable conductive material to form the vias 213. The copper is also plated with dendrites as described, for example, in U.S. Pat. No. 5,248, 262 to Busacco et al, to enhance the electrical connection between the solder balls and the vias.

As best shown in FIG. 7, the component locator 220 only captures a minor fraction of the balls. The IC module illustrated in FIG. 7 has 625 solder balls 246 (as in FIG. 2, only the balls in the outer rows have been drawn for ease of illustration), whereas the component locator 220 has 48 ball capture openings 226. With the manufacturing tolerances typically employed in manufacturing IC modules such as module 240 and the components to which they are connected, there is little chance that other balls will be misaligned if this many balls have been aligned correctly.

FIGS. 8A, 8B, and 8C illustrate three of many possible variation in the tabs and openings that capture the solder balls. In FIG. 8A, two tabs 328 are shown projecting from a side of the frame 322 of a component locator. Each tab 328 has two ball capture openings 326. One is positioned to capture a solder ball in the outer row in an array such as shown in FIG. 2, and the other is positioned to capture a ball in an intermediate or inner row.

FIG. 8B illustrates another modified tab 428, with four ball capture openings 426. Two are positioned to capture balls in an outer row of a ball array and two are positioned to capture balls in an intermediate or inner row. This embodiment, and the ones illustrated in 7 and 8A, can be readily modified to meet the needs of particular connections. With the tabs shown in FIGS. 8A and 8B, and with other variations, it might be desirable to use more tabs on each side of the frame to more closely approximate the number of holes in the tab 228 shown in FIGS. 3 and 7, or the distance between the most widely separated ball capture openings on one side of the frame. The shape of the ball capture openings may also be modified to fit particular applications. For example, it may be desirable to use holes with an inverted conical cross-section (i.e. with a bottom opening that is larger than the top), or with a counter-bore at the bottom of the hole, to control and provide additional room for reflowed solder. Capture openings with an hourglass configuration—a cone at the top of the opening to assist with alignment of the solder balls 226 and an inverted cone at the bottom of the opening for reflow solder control—could also be used.

These and other connector capture openings may also be used with solder columns, and other forms of protruding conductors, as well as with the solder balls 226 illustrated herein. Many other variations will be also be apparent to those skilled in the design and manufacture of these connectors.

The locator tabs in FIGS. 8A and 8B can be integrated into all types of sockets and testers where there is a need to locate solder balls precisely with respect to a contact mechanism. They do not need to be on a separate piece, as shown in FIG. 3, but can be molded into or attached to a socket housing or actuation mechanism.

FIG. 8C illustrates yet another type of locator tab 528, in which the capture openings 526 are semicircles which pick up just half of the solder ball. This version is especially easy to mold in large volumes.

A compressible connector assembly 170 is used to connect the integrated circuit module 240 to printed circuit board assembly 160. The connector assembly 170 is a buckling beam type, as described in U.S. Pat. No. 5,248,262 to Busacco et al, the disclosure of which is incorporated herein by reference.

As shown in FIG. 9 and 10, the compressible connector assembly 170 includes a upper housing 172 and a lower housing 174, each of which is preferably made of RYTON™, a product of Phillips Petroleum Company. Upper housing 172 and lower housing 174 have a series of slots, 176 and 178 respectively, which support a series of buckling beam connectors 180, one of which is shown in FIG. 4.

The outer housing 190 for compressible connector assembly 170 has one side with leaf springs 192 and three sides (one of which has been deleted to better illustrate the assembly procedure) with ledges 193. The upper housing 172 of the connector assembly has three sides with recessed top edges 173 that match the ledges 193. As shown in FIG. 10, the compressible connector assembly 170 is inserted into the outer housing 190 by pressing the side of connector assembly 170 that does not have a recessed top edge against the leaf springs 192, and then tilting the opposite side into the cavity defined by the ledges 193. Leaf springs 192 then hold the connector assembly in the desired position. The leaf springs also allow the connector assembly to slide to accommodate the buckling of individual buckling beam connectors 180 within upper housing 172 and lower housing 174.

As shown in FIG. 5 and 6, each buckling beam connector 180 is made up of a series of conductive elements or strips 182, which are preferably of beryllium-copper, but may be of copper, phosphor bronze or other suitable conductors. The conductive strips 182 are preferably covered on each side by a layer of polyimide 183 or other suitable dielectric. Openings 184 in the polyimide layer allow the individual conductive strips 182 to function independently, both mechanically and electrically. Small strips 185 of polyimide near the tips of the conductive strips 182 hold the strips together.

The upper and lower ends of the conductive strips 182 extend through the slots 176, 178 in the upper and lower housings 172, 174. As may be seen in FIG. 6, the upper end 186 of each conductive strip 182 is designed, positioned, and adapted to contact one of the vias 213 in redistribution film 210. The redistribution film prevents damage to the solder balls from the movement of the conductive strips 182 as the buckling beam connectors 180 flex under pressure and relax.

The solder balls 246 on the integrated circuit module 240 also contact vias 213, and complete electrical circuits from the IC chip in the module through the solder balls 226 and vias 213 to the upper ends 186 of the conductive strips 182. The lower ends 188 of the conductive strips 182 complete electrical circuits with contacts 168 on the surface of the printer circuit board 160.

Systems such as these may be used for testing electrical components such as the illustrated IC modules quickly, precisely, and economically. The component locator 220 allows for quick change of the modules under test in both a full manufacturing environment or a lab doing board and module prototyping. The locator provides the necessary means to locate the module contacts to the board contact pads. These locators can also be used for module sorting or matching where a card or board assembly can be built using these locators to determine the best matched set of modules for a specific application. In other applications, the assembled system may be heated with the component locators in place, thereby reflowing lower melting solder around the solder balls to form a permanent electrical connection between the two components.

The assembly of the components described above may be understood with reference to FIGS. 1, 4, 11 and 12. The various components are assembled upon and aligned, either directly or indirectly, by a reference pin 125 and a rotation pin 127. The rotation pin is diagonally across the locator/stiffener 120 from reference pin 125. Reference pin 125 controls the location of each member of the socket, and the board, in the X and Y directions, i.e. in the plane of the PC board 160. The spacer 140, the printed circuit board 160, the outer housing 190 for the compressible circuit connector, the redistribution film 210 and the component locator 220 each have a reference hole (145, 165, 195, 215 and 225 respectively) which is sized to fit the reference pin 125. (Reference pin 125 may be 3.45±0.013 mm in diameter, and holes 145, 165, 195, 215 and 225 may be 3.5±0.025 mm in diameter.) Similarly, latch 260 has a reference slot 285 that is sized to fit reference pin 125.

Rotation pin 127 which, as best seen in FIG. 7, is diamond shaped, controls the rotation of each of the members of the socket and board. The longest diagonal of this pin, which is substantially the same size as rotation holes 147, 167, 197, 217 and 227 (in the spacer 140, the printed circuit board 160, the outer housing 190 for the compressible connector assembly, the redistribution film 210 and the component locator 220) and a rotation slot 265 in latch 260, controls rotation of these members about reference pin 125. The diamond shape of pin 127 facilitates assembly of the members if there are some minor variations in dimensions.

The locator/stiffener 120 also has two clamping pins 129. The spacer 140, the printed circuit board 160, the outer housing 190 for the compressible circuit connector, the redistribution film 210 and the component locator 220 each have two clamping holes 149, 169, 199, 219 and 229, designed to fit the clamping pins 129. The clamping pins 129, along with the reference pin 125 and rotation pin 127, are used to clamp the socket members together The rotation holes 147, 167, 197, 217 and 227, the longest diagonal of the rotation pin 127, and the head 135 of the rotation pin 127 are larger than the reference and clamping holes. Thus, the components will only fit together when oriented in one manner, which helps ensure that the solder balls 226, the vias 213, the upper ends 186 and lower ends 188 of the conductive strips in the buckling beam connectors, and the contacts 166 on the printed circuit boards are all aligned correctly. The corners of the spacer, outer housing for the compressible connector assembly, redistribution film, component locator and latch are chamfered (cut at a 45 degree angle) or otherwise marked, and the printed circuit board and IC module are marked, to aid assembly and to ensure the correct orientation of each member and the module to the contacts on the printed circuit board.

The first step in the assembly process is to place the spacer 140 on the reference, rotation and clamping pins 125, 127,129. In the embodiment illustrated in FIG. 1, the spacer is made of an elastomeric material which provides resilience in the overall assembly so that the assembled components can be compressed slightly to facilitate installation of latch 260. The elastomeric spacer also maintains contact pressure on the assembled components. As explained below, non-elastomeric spacers may be used with other embodiments of this invention.

The reference, rotation and clamping pins are inserted into the corresponding holes in the PC board 160, and outer housing 190, with the compressible connector assembly 170 in position as described above, is placed on the pins. Outer housing 190 holds the connector assembly in position with a tolerance of ±0.001".

Redistribution film 210 and component locator 220 are then placed on the pins, and IC module 240 is placed on the component locator frame 220 so that the solder balls 246 on the module go into the ball capture holes 226. Component locator 220 is machined to position the solder balls 246 with an accuracy of ±0.003". This accuracy is obtained, in part, by machining the ball capture holes 226 in the component locator 220 with a laser profiler.

Assembly is completed by placing latch 260 above the IC module. The illustrated latch contains three different types of openings to facilitate assembly and latching—a keyhole-like rotation slot 265 sized to fit the rotation pin 127, a keyhole-like clamping slot 275, substantially the same as rotation slot 265 but sized to fit the clamping pins 129, a semicircular stepped reference slot 285 sized to fit reference pin 125, and a semicircular stepped clamping slot 295 sized to fit the clamping pins 129.

As best seen in FIG. 12A, rotation pin 127 and clamping pins 129 have necks 131, 133 that are slightly smaller than the lower portions of the pins, and enlarged heads 135, 137 to hold the latch 260 on the completed assembly. Rotation slot 265 has a cylindrical hole 266 that allows the enlarged head 135 of the rotation pin 127 to pass through, and clamping slot 275 has a cylindrical hole 276 that allows the enlarged head 137 of the clamping pin 129 to pass through. Stepped slots 267, 277 extend to the left of the cylindrical holes 266, 276. Each of these stepped slots 267, 277 has a upper slot 268, 278 extending from the top of the latch to a shoulder 269, 279. The upper slots 268, 278, like cylindrical holes 266, 276, are wide enough to accommodate, respectively, the head 135 of the rotation pin 127 or the head 137 of a clamping pin 129.

Lower slots 270, 280 extend from shoulders 269, 279 to the bottom of the latch. The lower slots are wide enough for the necks 131, 133 of the rotation and clamping pins 125, 127, respectively, but not large enough for the heads 135, 137 of the pins to pass through. The sides of lower slots 270, 280 define ramps 272, 282 that, as explained below, are used to lock the latch in place and exert pressure on the assembled components.

The semi-circular stepped reference slot 285 and clamping slot 295 are similar in construction to stepped slots 267 and 277. Each of the semi-circular stepped slots 285, 295 includes an upper slot 288 (large enough for the head of the corresponding reference or clamping pin), a shoulder 289 and a lower slot 290 (which is as least as wide as the neck of the corresponding pin, but not large enough for the head to pass through). The sides of lower slots 290 define ramps 292 that, in cooperation with the ramps 272, 282 in lower slots 270, 280, are used to lock the latch in place and exert pressure on the assembled components.

The latch is placed on the assembled components so that the head 135 of the rotation pin 127 enters the cylindrical hole 266 in the keyhole-like rotation slot 265, and the head 137 of one of the clamping pins enters the cylindrical hole 276 of the keyhole-like clamping slot 275. The latch is pressed to compress the spacer 140 and allow the heads 135, 137 of the pins to pass the shoulders 269, 279 of rotation and locator slots 265,275. The latch 260 is then slid to the right, using the knurled knobs 262 on top of the latch, so that the heads of the rotation, clamping and reference pins ride up the ramps 272, 282, 292 defined by the sides of the lower slots 270, 280, 290, and into the back of the upper slots 268, 278, 288, where they are supported by shoulders 269, 279, 289. The ramps and shoulders are designed, in combination with the locator/stiffener 120 and spacer 140, to develop and maintain the desired contact pressure on the assembled electrical components. This pressure is applied to the IC module 240, transmitted by the solder balls 246 on the module 240 through the vias 213 to the conductive strips 182, and transmitted by the conductive strips to the contacts 166 on printed circuit board 160. In the process, buckling beam connectors 180 are compressed and deflect, as illustrated in U.S. Pat. No. 5,248,262, into a position wherein they maintain the desired contact pressure, typically about 50 grams per ball, on the components. Thus, in addition to insuring accurate alignment and proper connections between the solder balls 146, the vias 213, the buckling beam connectors 180 and the printed circuit contacts 168, the contact pressure provided by this apparatus ensures good electrical connection between the components. In other embodiments of this invention, connector assembly 220 may be omitted, and the solder balls or other protruding connections may make direct contact with a contact on a second component.

The frame 121 of locator/stiffener 120 includes crossmembers 122 that meet at a central hub 123. The hub stiffens the assembly, so that the pressure applied to the IC module 240 does not unduly deform the printed circuit board 160. The locator/stiffener may, optionally, include an actuator screw 134 that extends through a threaded hole 124 in the central hub 123. Actuator screw 134 can be used to adjust the pressure on the spacer 140, and push spacer 140 away from locator/stiffener 120 to press PC board 160 towards latch 260. This causes the buckling beam connectors 180 to buckle and apply a normal force of 50 grams nominal on each of the vias on redistribution film 210. When used in this fashion, spacer 140 must be able to support PC board from bowing as a result of the normal force applied by the buckling members 180. Thus, when used with screw 134, spacer 140 is not elastomeric. Otherwise, spacer 140 is of elastomeric material.

FIGS. 13 and 14 illustrate an alternate actuator assembly 360 that may be used in place of actuator 260. Actuator assembly 360 has a frame 362 that defines a central channel 364 and an actuator screw 372 that extends through a threaded hole 370 in the frame into the central channel 364. A force block 380 is mounted on the lower end of the actuator screw 372 so that the screw can rotate with respect to the block. Rotation of the screw moves the force block 380 up and down in central channel 364, and causes the force block to exert pressure on an IC module 340.

Like module 240, module 340 has an array of solder balls 346 on its bottom surface. Module 340 also has a heat sink 350 affixed to its upper surface. Force block 380 presses against heat sink 350. The heat sink, force block and actuator frame 362, all of which are preferably made of metal, cooperate in the dissipation of heat from the IC module.

Like the latch shown in FIG. 1, actuator 360 has a rotation slot (hidden in the upper corner of FIG. 13) sized to fit rotation pin 127. Actuator 360 also has one semicircular reference slot 365 sized to fit reference pin 125, and a keyhole-like clamping slot 366 and semicircular clamping slot 368 sized to fit clamping pins 129. These slots do not have the ramps shown in FIGS. 11 and 12, because actuator 360 does not employ a ramping action to develop pressure on the components. In all other respects, the slots are substantially the same.

Actuator 360 exerts pressure on the components with the actuator screw and force block. The head 374 of actuator screw 372 has a hexagonal 376 socket that can accommodate a suitable wrench, preferably a calibrated torque driver. The torque required will vary depending upon the number of balls on the module. With 625 balls, the torque will typically be on the order of 4 in-lbs.

A similar method for applying pressure may be employed in the embodiment in FIG. 1, using the optional actuator screw 134 in the central hub 124. As mentioned above, this actuator screw 134, in addition to developing pressure on the electrical components in the system, can help the printed circuit board 160 resist pressures exerted on it from above. The modified spacer used with actuator screw 134 is made of metal or other rigid material to apply the load to the system and to support printed circuit board from deflecting during actuation.

Thus, it may be seen that this invention provides an adaptable system for locating electrical components precisely, quickly and economically. The illustrated embodiments of this invention provide a means for aligning and connecting electrical components, quickly, precisely, and economically, either temporarily for testing or permanently. Chances of misalignment and short circuits are substantially reduced. As noted above, alignment tolerances of 0.003" or better can be achieved with this invention. As those skilled in the art will readily appreciate, many modifications to these embodiments can be made within the scope of this invention, which is defined by the following claims.

We claim:

1. In a system for electrically interconnecting a first electrical circuit member having electrical contacts on a surface of said member with a second electrical circuit member having an array of conductors protruding from a surface of said second member, the improvement comprising:

an electrically insulating component locator; and means for aligning said component locator with said first circuit member;

said component locator comprising a frame having a central opening and capture openings located in said frame, said openings capture being sized and positioned so that some but not all of said protruding conductors, located in one or more outer rows of said array, extend into said openings, whereby said second circuit member is positioned in a predetermined position and said conductors are positioned to complete electrical circuits with preselected contacts on said first circuit member.

2. Apparatus according to claim 1 wherein said capture openings are about 0.040" in diameter, and said balls are about 0.035" in diameter.

3. Apparatus according to claim 1 wherein said metal balls comprise solder.

4. Apparatus according to claim 1 wherein said component locator comprises a sheet of thermoplastic polyester.

5. Apparatus according to claim 4 wherein said thermoplastic is heated at a temperature of about 160° for about 30 minutes to reduce shrinkage in operation.

6. Apparatus according to claim 1 wherein:

said first electrical circuit member comprises a compressible connector assembly electrically connected to a printed circuit board; and said second electrical circuit member comprises an integrated circuit module having an array of solder balls on a surface of said member.

7. Apparatus according to claim 1 wherein only a minor fraction of the conductors in said array enter said capture openings.

8. In a system for electrically interconnecting a first electrical circuit member having electrical contacts on a surface of said member with a second electrical circuit member having an array of metal balls protruding from a surface of said second member, the improvement comprising:

an electrically insulating component locator; and means for aligning said component locator with said first circuit member;

said component locator comprising a frame with a central opening therein, one or more tabs extending into said central opening, and capture openings sized and positioned so that said metal balls extend into said openings, with at least some of said capture openings being located in at least one of said tabs, whereby said second circuit member is positioned in a predetermined position and said conductors are positioned to complete electrical circuits with preselected contacts on said first circuit member.

9. In a system for electrically interconnecting a compressible connector assembly electrically connected to a printed circuit board, said connector assembly having electrical contacts on a surface of said assembly, with an integrated circuit module having an array of solder balls on a surface of said member, the improvement comprising:

an electrically insulating component locator comprising a plurality of capture openings sized and positioned so that said solder balls extend into said openings, whereby said integrated circuit module is positioned in a predetermined position and said solder balls are positioned to complete electrical circuits with preselected contacts on said connector assembly;

means for aligning said component locator with said connector assembly; and a redistribution film of electrically insulating material having a plurality of conductive vias extending through said insulating material, said film being positioned between said integrated circuit module and said compressible connector assembly so that at least some of solder balls are in contact with at least some of said vias;

wherein said compressible connector assembly comprises a plurality of buckling conductive connectors, at least some of said buckling connectors having one end in contact with contact pads on said printed circuit board and another end with one of said vias, whereby said solder balls are electrically connected through said vias and said buckling connectors to said contact pads on said printed circuit board.

10. A connector for locating and electrically connecting a first electrical component having a plurality of contacts and a second electrical component having an array of protruding conductors comprising:

- a compressible connector assembly having a plurality of buckling beam connectors, each of said buckling beam connectors comprising a plurality of conductive elements having a first end and a second end adapted to extend from said compressible connector assembly, said first end of said conductive elements being in contact with said contacts on said first component;
- an electrically insulating component locator positioned between said compressible connector assembly and said second component, said component locator comprising a frame having a central opening and openings located in said frame, said openings being sized and spaced so that some but not all of said protruding conductors can extend into said openings;
- whereby said second electrical component is maintained in a preselected position, said protruding conductors make electrical connections with preselected ends of said buckling beam connectors, and said protruding conductors make electrical connections with preselected contacts on said printed circuit board through said buckling beam conductive elements.

11. A connector according to claim 10 wherein said protruding conductors comprise solder balls.

12. A connector according to claim 11 wherein said first electrical circuit member comprises a printed circuit board and said second electrical circuit member comprises an integrated circuit module.

13. A connector for locating and electrically connecting a first electrical component having a plurality of contacts and a second electrical component having a plurality of protruding conductors comprising:

- a compressible connector assembly having a plurality of buckling beam connectors, each of said buckling beam connectors comprising a plurality of conductive elements having a first end and a second end adapted to extend from said compressible connector assembly, said first end of said conductive elements being in contact with said contacts on said first component;
- an electrically insulating component locator positioned between said compressible connector assembly and said second component, said component locator comprising a plurality of openings sized and spaced so that at least some of said protruding conductors can extend into said openings; and
- a redistribution film of electrically insulating material having a plurality of conductive vias extending through said insulating material, said film being positioned between said integrated circuit module and said compressible circuit member so that at least some of said protruding conductors are in contact with at least some of said vias;

whereby said second electrical component is maintained in a preselected position, said protruding conductors make electrical connections with preselected ends of said buckling beam connectors, said protruding conductors make electrical connections with preselected contacts on said printed circuit board through said buckling beam conductive elements; and at least some of said protruding conductors make electrical contact with at least some of said buckling beam connectors through said vias and make electrical contact with at least of said contacts on said first electrical component through said vias and said buckling beam connectors.

14. A connector for locating and electrically connecting a printed circuit board having a number of contacts and a second electrical component having a plurality of protruding conductors comprising:

- a compressible connector assembly mounted within a connector assembly housing and having a plurality of buckling beam connectors, each of said buckling beam connectors comprising a plurality of conductive elements having a first end and a second end adapted to extend from said compressible connector assembly, said first end of said conductive elements being in contact with said contacts on said first component;
- an electrically insulating component locator positioned between said compressible connector assembly and said second component, said component locator comprising a plurality of openings sized and spaced so that at least some of said protruding conductors can extend into said openings; and
- an alignment member having a base and a plurality of pins extending from said base, said pins being positioned and adapted to extend through holes in said printed circuit board, through holes in said connector assembly housing, through holes in said component locator, and through holes in a latch member positioned and adapted to hold said second electrical component against said component locator;

whereby said second electrical component is maintained in a preselected position, said protruding conductors make electrical connections with preselected ends of said buckling beam connectors, and said protruding conductors make electrical connections with preselected contacts on said printed circuit board through said buckling beam conductive elements.

15. A method for positioning an integrated circuit module, having an array of conductors protruding from a surface of said module, with respect to a printed circuit board, comprising:

aligning a compressible connector assembly with respect to said printed circuit assembly;

aligning a locating frame, having a central opening and capture openings adapted to receive some but not all of said protruding conductors and locate said module in a predetermined position with respect to said compressible connector assembly; and placing said module against said locating frame, whereby said protruding connectors extend into said openings, said module is located in a predetermined location with respect to said connector assembly, and said connectors are electrically connected to predetermined contacts on said connector assembly.

16. A method of temporarily connecting a plurality of electrical components, a first one of said components having contacts on at least one surface and a second one of said components having an array of protruding conductors spaced and adapted to complete an electrical circuit with preselected ones of said contacts, comprising:

aligning a locating frame, having a central opening and capture openings located in said frame and adapted to receive some but not all of said protruding conductors, with respect to said first component;

placing said second component against said locating frame, whereby said protruding conductors extend into said capture openings, said second component is located in a predetermined position with respect to said first component, and said conductors are electrically connected to predetermined contacts on said first component; and pressing said second component against said locating frame.

17. A method according to claim 16 further comprising testing at least one of said electrical components while said second component is pressed against said locator frame.

* * * * *